United States Patent [19]

Sato et al.

[11] Patent Number: 5,292,613
[45] Date of Patent: Mar. 8, 1994

[54] PHOTOSENSITIVE TRANSFER MATERIAL AND IMAGE-FORMING PROCESS

[75] Inventors: Morimasa Sato; Masayuki Iwasaki; Fumiaki Shinozaki, all of Shizuoka,, Japan

[73] Assignee: Fuji Photo Film Co., Ltd., Kanagawa, Japan

[21] Appl. No.: 827,765

[22] Filed: Jan. 29, 1992

[30] Foreign Application Priority Data

Jan. 29, 1991 [JP] Japan .................................. 3-9292
May 24, 1991 [JP] Japan .................................. 3-120228

[51] Int. Cl.⁵ .............................................. G03C 11/12
[52] U.S. Cl. .................................... 430/257; 430/262; 430/263; 430/349
[58] Field of Search ............... 430/256, 257, 262, 349, 430/330, 263, 252

[56] References Cited

U.S. PATENT DOCUMENTS

| | | | |
|---|---|---|---|
| 3,884,693 | 5/1975 | Bauer et al. | 430/263 |
| 4,268,601 | 5/1981 | Namiki et al. | 430/263 |
| 4,719,169 | 1/1988 | Platzer et al. | 430/257 |
| 5,093,168 | 3/1992 | Suzuki et al. | 430/262 |

FOREIGN PATENT DOCUMENTS 637711  3/1962  Canada ................................ 430/263

*Primary Examiner*—Charles L. Bowers, Jr.
*Assistant Examiner*—Mark F. Huff
*Attorney, Agent, or Firm*—Sughrue, Mion, Zinn, Macpeak & Seas

[57] ABSTRACT

A photosensitive transfer material is described, comprising a temporary support having formed thereon in sequence a thermoplastic resin layer, a separating layer having only slight permeability to oxygen, and a photosensitive resin layer, wherein the adhesion between the thermoplastic resin layer and the separating layer is weakest. The photosensitive transfer material is useful, for example, for an image-forming process.

19 Claims, No Drawings

PHOTOSENSITIVE TRANSFER MATERIAL AND IMAGE-FORMING PROCESS

FIELD OF THE INVENTION

The present invention relates to a photosensitive transfer material suitable for dry transferring the photosensitive resin layer thereof onto a substrate having an uneven surface and to an image-forming process using the photosensitive transfer material. More particularly, the invention relates to a photosensitive transfer material suitable for making color filters being used for liquid crystal displayers and the like, and for making printed circuit boards. The present invention further relates to an image-forming process using the photosensitive transfer material.

BACKGROUND OF THE INVENTION

An image-forming material for transferring the photosensitive resin layer thereof onto a substrate is known and disclosed in JP-B-56-40824 (corresponding U.S. Pat. No. 3,884,693) (the term "JP-B" as used herein means an "examined published Japanese patent application"). The image-forming material is used for making printed circuits, intaglio printing plates, relief printing plates, name plates, multicolor proofs, offset printing plates, screen printing stencils, etc.

The transfer material is composed of a temporary support, a separating layer, and a photopolymerizing layer. The photopolymerizing layer of the transfer material is laminated onto a substrate, then the temporary support only is separated therefrom, the photopolymerizing layer is imagewise exposed through the separating layer, and the photopolymerizing layer is developed to form images on the substrate. In this case, the separating layer allows for the imagewise exposure in air by intercepting oxygen, which is important since the thickness of the separating layer is very thin, as from about 0.5 μm to 5 μm. The resolving power is not affected.

However, when the substrate onto which the photopolymerizing layer is transferred becomes somewhat uneven and if the separating layer has the foregoing thickness, bubbles are enclosed between the photopolymerizing layer and the substrate, causing inferior transfer.

JP-A-2-213849 (the term "JP-A" as used herein means an "unexamined published Japanese patent application") discloses a transfer material having an interlayer of a polyvinyl alcohol derivative between a temporary support and a photosensitive resin layer. The interlayer is formed for improving the releasability of the photosensitive layer from the temporary support and the dissolution characteristics. However, no consideration is given to the transferring property of the photosensitive resin layer in the case where the substrate has an uneven surface.

Also, JP-A-63-309946 describes that since the sufficient adhesion of a transferred layer to a permanent support is obstructed by the existence of fine irregularity on the permanent support or the existence of fine particles such as fine dusts on the permanent support or the transferred layer, inferior transfer occurs. To prevent the undesirable inferior adhesion, a compressible temporary support is used. This technique is certainly effective, but is still insufficient for transferring a non tacky photosensitive resin layer, which becomes tacky at a temperature of not higher than 150° C. but not-tacky at a room temperature, onto a permanent support having an unevenness of the same thickness as that of the photosensitive resin layer, as bubbles form between the photosensitive resin layer and the permanent support.

SUMMARY OF THE INVENTION

A first object of the present invention is to provide a photosensitive transfer material capable of transferring the photosensitive resin layer of the photosensitive transfer material onto a final support or a permanent support without causing inferior transfer caused by fine dusts and bubbles, or the irregularity of the surface of the final or permanent support. Further, the invention must be capable of sufficiently separating the photosensitive resin layer from the temporary support and image-exposing in air.

A second object of this invention is to provide a photosensitive transfer material capable of forming stainless images having no stains on a substrate.

A third object of this invention is to provide a photosensitive transfer material having a thermoplastic resin layer showing excellent adhesion between the thermoplastic resin layer and the temporary support.

A fourth object of this invention is to provide a photosensitive transfer material having a temporary support showing excellent adhesion between a thermoplastic resin layer and the temporary support.

A fifth object of this invention is to provide a photosensitive transfer material which helps reduce the effects of static electricity such as accumulation of dust or shocks to operators which often occurs when separating the temporaty support.

The sixth object of the present invention is to provide an image-forming process using the photosensitive transfer material.

It has now been discovered that the foregoing objects can be achieved by the present invention as described hereinafter.

That is, the first object of this invention described above can be achieved by a photosensitive transfer material comprising a temporary support having formed thereon in sequence a thermoplastic resin layer, a separating layer having only a slight permeability for oxygen, and a photosensitive resin layer, wherein the adhesive power between the thermoplastic resin layer and the separating layer is weakest.

In another aspect, the present invention is directed to an image-forming process, which comprises peeling off the temporary support and the thermoplastic resin layer, pattern-exposing the photosensitive resin layer through the separating layer, and developing the photosensitive resin layer to form images on the permanent support after closely adhering the photosensitive resin layer of the foregoing photosensitive transfer material to a permanent support while slightly heating and, if necessary, pressing them.

The second object of this invention can be achieved by the foregoing photosensitive transfer material, wherein the thermoplastic resin layer is soluble in an aqueous alkali solution.

The third object of this invention can be achieved by the foregoing photosensitive transfer material, wherein the thermoplastic resin layer thereof soluble in an aqueous alkali solution further contains a releasing agent.

The fourth object of this invention can be achieved by the foregoing photosensitive transfer material, wherein the thermoplastic resin layer is soluble in an aqueous alkali solution, further and the temporary support is a plastic film having a gelatin subbing layer.

The fifth object of this invention can be achieved by the foregoing photosensitive transfer material, wherein the surface electric resistance of the temporary support is not higher than $10^{13}$ Ω.

DETAILED DESCRIPTION OF THE INVENTION

The invention is described in detail below.

The temporary support of the photosensitive transfer material of this invention is composed of a chemically and thermally stable, flexible material. Preferably, a thin sheet of polyethylene phthalate, polycarbonate, polyethylene, polypropylene, etc., or a laminate thereof is used.

The thickness of the temporary support is properly from 5 to 300 μm, preferably from 5 to 150 μm, and more preferably from 20 to 150 μm.

For improving the adhesion of the temporary support with the alkali-soluble thermoplastic resin layer, a surface treatment such as a glow discharging treatment, a corona discharging treatment, or an ultraviolet ray radiation treatment; or a subbing treatment with a polyvinylidene chloride resin, a styrene butadiene rubber, or a gelatin may be applied to the temporary support. A phenolic material such as a cresol novolak resin, or resorcinol may be incorporated in the thermoplastic resin layer. Further, a combination of these treatments can be used.

In the temporary supports treated as described above, a polyethylene terephthalate film having a gelatin subbing layer is preferable, allowing for excellent adhesion to the thermoplastic resin layer. In particular, a polyethylene terephthalate film subjected to the gelatin subbing treatment after applying thereto a corona discharging treatment is more preferable since in this case, the film allows for more excellent adhesion to the thermoplastic resin layer. In this case, the thickness of the gelatin subbing layer is from 0.01 μm to 2 μm.

The softening point of the thermoplastic resin layer of the photosensitive transfer material of this invention is preferably not higher than 100° C. It is preferred that the organic polymeric material being used as the thermoplastic resin layer is selected from organic polymeric materials having a softening point, determined by a Vicat method (i.e., the polymer softening point measuring method according to ASTMD 1235), of not higher than about 80° C. The reason is that by using a polymer having a low softening point, in the case of transferring the photosensitive transfer material or the transfer sheet onto a substrate having unevenness by heating and pressing, the polymer completely absorbs the unevenness of the substrate, e.g., unevenness due to resist or unevenness being inherently formed. Additionally, the photosensitive transfer material or the transfer sheet can be transferred thereto without the formation of bubbles. On the other hand, when a polymer having a high softening point is used, it is necessary to carry out the transfer at a high temperature, which is disadvantageous for practical use. Thus, the softening point of the organic high molecular material or polymer being used as the thermoplastic resin layer is 80° C. or lower, preferably 60° C. or lower, and more preferably 50° C. or lower.

The organic polymeric material having a softening point of lower than about 80° C. is preferably selected from polyolefins such as polyethylene and polypropylene; ethylene copolymers such as an ethylenevinyl acetate copolymer, the saponification product thereof, an ethylene-acrylic acid ester copolymer and the saponification product thereof; polyvinyl chloride; vinyl chloride copolymers such as a vinyl chloride-vinyl acetate copolymer and the saponification product thereof; polyvinylidene chloride; a vinylidene chloride copolymer; polystyrene; styrene copolymers such as a styrene-(meth)acrylic acid ester copolymer and the saponification product thereof; polyvinyltoluene; vinyltoluene copolymers such as a vinyl toluene(meth)acrylic acid ester copolymer and the saponification product thereof; poly(meth)acrylic acid ester; (meth)acrylic acid ester copolymers such as a butyl (meth)acrylate-vinyl acetate copolymer; a vinyl acetate copolymer; polyamide resins such as nylon, copolymerized nylon, N-alkoxymethylate nylon and N-dimethylaminated nylon.

Furthermore, the organic polymeric materials having a softening point of lower than about 80° C. described in *Plastic Property Handbook* (edited by Nippon Plastic Kogyo Renmei and Zen-Nippon Plastic Seikei Kogyo Rengokai, published by Kogyo Chosakai, Oct. 25, 1968) can be used.

Also, various plasticizers having a compatibility with these organic polymeric materials can be added to the organic polymeric materials to reduce the substantial softening point. Moreover, in the organic polymeric materials having a softening point of higher than 80° C., the substantial softening point thereof can be lowered below 80° C. by adding various plasticizers having a compatibility with the organic polymeric materials to them.

Practical examples of the preferred plasticizer are polypropylene glycol, polyethylene glycol, dioctyl phthalate, diheptyl phthalate, dibutyl phthalate, tricresyl phthalate, cresyldiphenyl phosphate and biphenyldiphenyl phosphate.

For adjusting the adhesive property of the photosensitive resin to the temporary support, various kinds of polymers, supercooling materials, adhesion improving agents, surface active agents, and releasing agents can be added to the organic polymeric materials having a substantial softening point of 80° C. or less.

The thickness of the thermoplastic resin layer is preferably about 6 μm or above. The reason is that if the thickness of the thermoplastic resin layer is less than 5 μm, it is difficult to completely absorb the unevenness of larger than 1 μm of the substrate. Also, there is no particular restriction on the upper limit of the thickness from the viewpoint of performance. However, the upper limit is not higher than about 100 μm, preferably not higher than about 50 μm from the viewpoint of production aptitude.

The alkali-soluble thermoplastic resin being used in this invention is dissolved in an aqueous alkali solution and the softening point of the resin is preferably 100° C. or lower. In this case, the aqueous alkali solution may be same as or different from the alkaline developer for the photosensitive transfer material of this invention.

In this case, the aqueous alkali solution means an aqueous solution of an alkaline material. The solution may further contain a small amount of an organic, water-miscible solvent.

Examples of the suitable alkaline material are alkali metal hydroxides (e.g., sodium hydroxide and potassium hydroxide), alkali metal carbonates (e.g., sodium carbonate and potassium carbonate), alkali metal silicates (e.g., sodium silicate and potassium silicate), alkali metal metasilicates (e.g., sodium metasilicate and potassium metasilicate), trimethanolamine, diethanolamine, monoethanolamine, morpholine, tetraalkylammonium hydroxides (e.g., tetramethylammonium hydroxide), and trisodium phosphate.

The concentration of the alkaline material is from 0.01% by weight to 30% by weight. The pH is preferably from 8 to 14.

Examples of the foregoing suitable organic, water-miscible solvent are methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexane, ε-caprolactone, γ-butyrolactone, dimethylformamide, dimethylacetamide, hexamethylphosphoramide, ethyl lactate, methyl lactate, ε-caprolactum, and N-methylpyrrolidone.

The concentration of the organic, water-miscible solvent is from 0.1% by weight to 30% by weight.

Also, the aqueous alkali solution can contain a surface active agent. The concentration of the surface active agent is from 0.01% by weight to 10% by weight.

As the resin soluble in the aqueous alkali solution, there are known polymeric binders being used for an alkali-soluble photopolymerizable resin. Examples of the binder are a copolymer of (meth)acrylic acid and a (meth)acrylic acid alkyl ester (examples of the alkyl group are methyl, ethyl, and butyl), poly(meth)acrylic acid, a copolymer of styrene and an unsaturated dibasic acid anhydride such as maleic anhydride, a reaction product of the foregoing polymer and an alcohol, and a reaction product of cellulose and a polybasic acid anhydride.

In the foregoing polymers, examples of the polymer being suitably used in this invention are a styrene/maleic anhydride copolymer, a quaternary copolymer of methyl methacrylate/methacrylic acid/2-ethylhexyl methacrylate/benzyl methacrylate described in JP-A-60-258539 (corresponding to U.S. Pat. No. 4,629,680), a styrene/maleic acid mono-n-butyl ester copolymer described in JP-B-55-38961, a quaternary copolymer of styrene/methyl methacrylate/ethyl acrylate/ methacrylic acid described in JP-B-54-25957, a benzyl methacrylate/methacrylic acid copolymer described in JP-A-52-99810 (corresponding to U.S. Pat. No. 4,139,391), a ternary copolymer of acrylonitrile/2-ethylhexyl methacrylate/methacrylic acid described in JP-B-58-12577 (corresponding to U.S. Pat. No. 3,030,865), and a ternary copolymer of methyl methacrylate/ethyl acrylate/acrylic acid and a copolymer of styrene partially esterified with isopropanol and maleic anhydride both described in JP-B-55-6210.

The alkali-soluble thermoplastic resin is required to show a releasing property between the resin layer and a separating layer. For this, it is preferred to incorporate a releasing agent in the alkali-soluble thermoplastic resin. Silicone compounds and fluorinated alkyl-containing compounds are known releasing agents and can be advantageously used in this invention.

Examples of the particularly preferable silicone compound are Ebecryl 1360 and Ebecryl 350 (trade names, made by Daicel UCB K.K.), dimethylsilicone oil TSF400, methylphenyl silicone oil TSF4300, and silicone polyether copolymers TSF4445, TSF4446, TSF4460, and TSF4452 (trade names, made by Toshiba Silicone K.K.).

The fluorinated alkyl group-containing compounds include fluorine series surface active agents and fluorine series graft polymers.

Examples of the fluorine series surface active agent are a perfluoroalkyl group.hydrophilic group-containing oligomer F-171, a perfluoroalkyl group.oleophilic group-containing oligomer F 173, a perfluoroalkyl group hydrophilic group.oleophilic group-containing oligomer F-177, perfluoroalkyl group.oleophilic group-containing urethanes F-183 and F-184 (trade names, made by Dainippon Ink and Chemicals, Inc.). Examples of the fluorine series graft polymers are Arron GF-300 and Arron GF-150 (trade names, made by Toagosei Chemical Industry Co., Ltd.).

The material used as the separating layer shows a low oxygen permeability and may be dissolved in water or an aqueous alkali solution. The materials include polyvinyl ether/maleic anhydride copolymers, a water-soluble salt of a carboxyalkyl cellulose, water-soluble cellulose ethers, a water-soluble salt of carboxyalkyl starch, polyvinyl alcohol, polyvinyl pyrrolidone, various kinds of polyacrylamides, various kinds of water-soluble polyamides, a water-soluble salt of polyacrylic acid, gelatin, an ethylene oxide polymer, a water-soluble salt of a group selected from various kinds of starches and the analogs, a styrene/maleic acid copolymer, a maleate resin, or a combination of them as described in JP-A-46-2121 and JP-B-56-40824 (corresponding to U.S. Pat. No. 3,884,693).

In the foregoing materials, a combination of polyvinyl alcohol and polyvinyl pyrrolidone is particularly preferable. In the combination, polyvinyl alcohol has preferably a saponification ratio of 80% or higher and the content of polyvinyl pyrrolidone is preferably from 1% by weight to 75% by weight of the solid components of the separating layer. If the content thereof is less than 1% by weight, a sufficient adhesion of the separating layer with the photosensitive resin layer is not obtained. On the other hand, if the content is over 75% by weight, the separating layer is dissolved by the solvent of the photosensitive resin at the time of coating the photosensitive resin layer, whereby a separating layer is not formed.

The thickness of the separating layer is very thin as from about 0.1 μm to 5 μm, preferably from 0.5 μm to 2 μm. If the thickness of the separating layer is less than about 0.1 μm, the permeability of oxygen is too high. On the other hand, if the thickness thereof is over about 5 μm, too much time is required to develop the photosensitive or photopolymerizing layer or to remove the separating layer.

The photosensitive resin layer preferably is softened or becomes tacky at a temperature of not higher than 150° C. but becomes non-tacky at a room temperature, and also is preferably thermoplastic. The layers formed by using known photopolymerizable compositions mostly have the foregoing properties and the properties of some layers can be further improved by adding thereto a thermoplastic binder or a compatible plasticizer.

As the material for the photosensitive resin layer of the photosensitive transfer material of this invention, all the photosensitive resins described, for example, in JP-A-3-282404 (corresponding to U.S. patent application Ser. No. 675,825, now U.S. Pat. No. 5,155,005) can be used. There is, for example, a photosensitive resin composition composed of a negative-working diazo resin and a binder, a photopolymerizable resin composition, a photosensitive resin composition composed of an azide compound and a binder, and a cinnamic acid-type photosensitive resin composition. On these materials, the photopolymerizable resin composition is particularly preferred. The photopolymerizable resin composition contains a photopolymerization initiator, a photopolymerizable monomer, and a binder as the fundamental constituting elements.

Also, as a photosensitive resin, there are known a photosensitive resin developable with an aqueous alkali solution and a photosensitive resin developable with an organic solvent. From the viewpoint of preventing the occurrence of environmental pollution and the assurance of labor safety, a photosensitive resin developable with an aqueous alkali solution is preferable.

The alkaline developer for developing the photosensitive resin layer of this invention is an aqueous solution of mainly an alkaline material. The developer may further contain a small amount of an organic water-miscible solvent.

Examples of the suitable alkaline material are alkali metal hydroxides (e.g., sodium hydroxide and potassium hydroxide), alkali metal carbonates (e.g., sodium carbonate and potassium carbonate), alkali metal bicarbonates (e.g., sodium hydrogen carbonate and potassium hydrogen carbonate), alkali metal silicates (e.g., sodium silicate and potassium silicate), alkari metal metasilicates (e.g., sodium metasilicate and potassium metasilicate), triethanolamine, diethanolamine, monoethanolamine, morpholine, tetraalkyl ammonium hydroxides (e.g., tetramethyl ammonium hydroxide), and trisodium phosphate. In this case, the concentration of the alkaline material is from 0.01% by weight to 30% by weight and pH thereof is preferably from 8 to 14.

Also, examples of the preferred organic water-miscible solvent are methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, $\epsilon$-caprolactone, $\gamma$-butyrolactone, dimethylformamide, dimethylacetamide, hexamethylphosphoramide, ethyl lactate, methyl lactate, $\epsilon$-caprolactum, and N-methylpyrrolidone.

The concentration of the organic water-miscible solvent is from 0.1% by weight to 30% by weight.

The alkaline developer can further contain a surface active agent and the concentration of the surface active agent is preferably from 0.01% by weight to 10% by weight.

The alkaline developer can be used as a bath liquid or a spraying liquid in this invention.

For removing the unhardened portions of the photopolymerizable resin layer, a method of rubbing the surface with a rotary brush in the developer, a method of rubbing the surface with a wetted sponge in the developer, or a combination of these methods can be employed. The temperature of the developer is preferably from room temperature to 40° C. A washing step can be employed after the development.

The photosensitive resin layer in this invention can further contain a dye or a pigment. In the case of using a pigment, the pigment must be uniformly dispersed in the photosensitive resin layer and has particle sizes of preferably not larger than 5 $\mu$m, and particularly preferably not larger than 1 $\mu$m. In the case of making a color filter, it is preferable to use a pigment having particle sizes of not larger than 0.5 $\mu$m.

Examples of the preferred dye and pigment are Victoria Pure Blue BO (C.I. 42595), Auramine (C.I. 1000), Fat Black HB (C.I. 26150), Monolite Yellow GT (C.I. Pigment Yellow 12), Permanent Yellow GR (C.I. Pigment Yellow 17), Permanent Yellow HR (C.I. Pigment Yellow 83), Permanent Carmine FBB (C.I. Pigment Red 46), Hosptaperm Red ESB (C.I. Pigment Violet 19), Permanent Rubine FBH (C.I. Pigment Red 11), Fastel Pink B Spura (C.I. Pigment Red 81), Monastral Fast Blue (C.I. Pigment Blue 15), Monolite Fast Black B (C.I. Pigment Black 1), and carbon.

Furthermore, examples of the suitable pigment for forming a color filter are C.I. Pigment Red 97, C.I. Pigment Red 122, C.I. Pigment Red 149, C.I. Pigment Red 68, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60, and C.I. Pigment Blue 64.

Also, it is preferable to form a thin covering sheet on the photosensitive resin layer on the opposite side of the support for protecting the photosensitive resin layer from being stained or scratched while in storage. The covering sheet may be composed of the same or similar material as the temporary support but must be easily separated form the photosensitive resin layer. For the material of the covering sheet, a silicone paper, a polyolefin sheet or a polytetrafluoroethylene sheet is suitably used.

The thickness of the covering sheet is preferably from about 5 $\mu$m to 100 $\mu$m. A polyethylene sheet or a polypropylene sheet having a thickness of from 10 $\mu$m to 30 $\mu$m is particularly preferred.

The photosensitive transfer material of this invention is prepared by coating a coating composition for a thermoplastic resin layer on a temporary support, followed by drying to form thereon the thermoplastic resin layer. Next, the thermoplastic resin layer is coated with a coating composition used in the separating layer which contains a solvent which does not dissolve the thermoplastic resin layer, followed by drying to form the separating layer. Next, the separating layer is coated with a coating composition used in the photosensitive resin layer containing a solvent which does not dissolve the separating layer, followed by drying to form the photosensitive resin layer. If desired, a covering sheet may be formed on the photosensitive resin layer.

Also, the photosensitive transfer material of this invention having a covering sheet can be advantageously prepared by forming a photosensitive resin layer on a covering sheet, separately forming a thermoplastic resin layer and a separating layer on a temporary support as described above, and then laminating both the elements such that the separating layer is brought into contact with the photosensitive resin layer. Furthermore, the photosensitive transfer material having a covering sheet can also be advantageously prepared by forming a thermoplastic resin layer on a temporary support, separately forming a photosensitive resin layer and a separating layer on a covering sheet, and then laminating both the elements such that the thermoplastic resin layer is brought into contact with the separating layer.

Also, in place of using a temporary support having a thermoplastic resin layer formed by coating, after forming a separating layer on a two-layer or multilayer sheet formed by adhering a thermoplastic resin sheet to a temporary support sheet, the photosensitive resin layer may be formed on the separating layer. In this case, a covering sheet may be also formed on the photosensitive resin layer.

As the thermoplastic resin sheet, the foregoing materials for the thermoplastic layer can be used and in these materials, a polyethylene film and a polypropylene film are particularly preferable.

As a method of forming a polyethylene film or a polypropylene film on a temporary support, there is included a method of coating a solution of, for example, polyvinyl acetate, polyvinyl chloride, an epoxy resin, polyurethane, a natural rubber, and a synthetic rubber, on the temporary support to form an adhesive layer, and laminating thereon a polyethylene film or a polypropylene film while pressing and heating; a method of coating a molten adhesive composed of an ethylene/vinyl acetate copolymer, an ethylene/acrylic acid ester copolymer, a polyamide resin, a petroleum resin, a rosin resin, a wax, or a mixture thereof on the temporary support and immediately thereafter, laminating thereto a polyethylene film or a polypropylene film; and a method of melting polyethylene or polypropylene, extruding the molten polymer in a film form by an extruding machine, and laminating the film in the molten state onto the temporary support under pressing.

Also, for improving the sliding property, preventing the occurrence of an undesirable adhesion of the photosensitive resin layer and the back surface of the temporary support, and preventing the formation of static electricity, it is useful to coat the back surface of the temporary support of the photosensitive transfer material of this invention with a sliding composition containing fine particles, a releasing composition containing a silicone compound, an antistatic agent composition.

After adhering the photosensitive resin layer of the photosensitive transfer material onto a permanent support, the temporary support of the photosensitive transfer material is peeled off. The film and the operator are thereby electrostatically charged allowing for the possibility of electric shock. Further, dust is attracted onto the film by the electrostatic charge to form unexposed portions in the subsequent exposure step, resulting in the formation of pin holes.

To prevent the occurrence of static electricity, it is preferred to form an electrically conductive layer on at least one surface of the temporary support to reduce the surface electric resistance thereof below $10^{13}$ $\Omega$, or imparting an electrical conductivity to the temporary support itself to reduce the surface electric resistance thereof below $10^{13}$ $\Omega$.

For imparting an electrical conductivity to the temporary support, an electrically conductive material may be incorporated in the temporary support. For example, a method of kneading fine particles of a metal oxide or an antistatic agent with the material for the temporary support is suitably used.

The metal oxide being used for the aforesaid purpose is at least one crystalline metal oxide selected from zinc oxide, titanium oxide, tin oxide, aluminum oxide, indium oxide, silicon oxide, magnesium oxide, barium oxide, molybdenum oxide, and/or the composite oxides thereof.

Examples of the antistatic agent being used for the aforesaid purpose are anionic surface active agents such as alkyl phosphate series surface active agents (e.g., Electrostripper A, trade name, made by Kao Corporation and Elenon No. 19, trade name, made by Dai-Ichi Kogyo Seiyaku Co., Ltd.), amphoteric surface active agents such as betaine series surface active agents (e.g., Amogen K, trade name, made by Dai-Ichi Kogyo Seiyaku Co., Ltd.), and nonionic surface active agents such as polyoxyethylene aliphatic acid ester series surface active agents (e.g., Nissan Nonion L, trade name, made by Nippon Oil and Fats Co., Ltd.) and polyoxyethylene alkyl ether series surface active agents (e.g., Emulgen(s) 106, 120, 147, 420, 220, 905, and 910, trade names, made by Kao Corporation and Nissan Nonion E, trade name, made by Nippon Oil and Fats Co., Ltd.).

Also, as other nonionic surface active agents, polyoxyethylene alkylphenol ether series surface active agents, polyhydric alcohol fatty acid ester series surface active agents, polyoxyethylenesorbitan fatty acid ester series surface active agents, and polyoxyethylene alkylamine series surface active agents can be used.

In the case of forming an electrically conductive layer on the temporary support, the electrically conductive layer can be properly selected from known electrically conductive materials, but the use of the fine particles of at least one kind of a crystalline metal oxide selected from ZnO, TiO$_2$, SnO$_2$, Al$_2$O$_3$, In$_2$O$_3$, SiO$_2$, MgO, BaO, MoO$_3$, and/or a composite oxide as the electrically conductive material is preferred since such a metal oxide shows an electrical conductivity that is not influenced by humidity.

The fine particles of the crystalline metal oxide or the composite oxide thereof have a volume resistivity of preferably not higher than $10^7$ $\Omega$·cm, and more preferably not higher than $10^5$ $\Omega$·cm.

Also, the particle sizes of the fine particles are preferably form 0.01 $\mu$m to 0.7 $\mu$m, and more preferably from 0.02 $\mu$m to 0.5 $\mu$m.

The production method of the fine particles of the electrically conductive crystalline metal oxide and the composite oxide thereof is described in detail in JP-A-56-143430 (corresponding to U.S. Pat. No. 4,495,276), along with the method thereof. That is, there is included a method of preparing fine particles of a metal oxide by burning and heat-treating the fine particles in the presence of a different atom for improving the electrical conductivity, a method of producing fine particles of a metal oxide by burning in the presence of a different atom for improving the electrical conductivity, and a method of reducing the oxygen concentration in the atmosphere by burning to introduce an oxygen defect into the metal oxide, thereby producing fine particles of a metal oxide.

Examples of the different atoms being used in the foregoing methods are Al, In, etc., for ZnO, Nb, Ta, etc., for TiO$_2$, and Sb, Nb, a halogen atom, etc., for SnO$_2$.

The addition amount of the different atoms is in the range of preferably from 0.01 mol % to 30 mol %, and more preferably from 0.1 mol % to 10 mol %.

The amount of the electrically conductive fine particles being used for the electrically conductive layer is preferably from 0.05 g/m$^2$ to 20 g/m$^2$, and more preferably from 0.1 g/m$^2$ to 10 g/m$^2$.

For the electrically conductive layer being used in this invention, gelatin; cellulose esters such as cellulose nitrate, cellulose triacetate, cellulose diacetate, cellulose acetate butyrate, and cellulose acetate propionate; homopolymers or copolymers containing vinylidene chloride, vinyl chloride, styrene, acrylonitrile, vinyl acetate, an alkyl (having from 1 to 4 carbon atoms) acrylate or vinyl pyrrolidone; a soluble polyester; polycarbonate; and a soluble polyamide can be used as the binder.

In the case of dispersing the electrically conductive fine particles in the binder, a dispersing agent such as a titanium series dispersing agent or a silane series dispersing agent may be added to the dispersion system. Also, for example, a binder crosslinking agent may be added thereto.

Examples of the titanium series dispersing agent described above are the titanate series coupling agents described in U.S. Pat. Nos. 4,069,192 and 4,080,353 and Prenact (trade name, made by Ajinomoto Co., Ltd.). Examples of the silane series dispersing agent are vinyltrichlorosilane, vinyltriethoxysilane, vinyl tris($\beta$-methoxyethoxy)silane, $\gamma$-glycidoxypropyltrimethoxysilane, and $\gamma$-methacryloxypropyltrimethoxysilane and also some of the silane series dispersing agents are commercially available as "silane coupling agents" from Shin-Etsu Chemical Co., Ltd.

Also, examples of the binder crosslinking agent described above are epoxy series crosslinking agents, isocyanate series crosslinking agents, aziridine series crosslinking agents, and epoxy series crosslinking agents.

The preferred electrically conductive layer in this invention can be formed by applying a dispersion of electrically conductive fine particles in a binder onto a temporary support or applying a subbing treatment onto the temporary support and applying thereon the electrically conductive fine particles.

In this invention, when the electrically conductive layer is formed on the temporary support at the opposite side to the photosensitive resin layer-carrying side, it is preferred to further form a hydrophobic polymer layer on the electrically conductive layer for improving the anti-scratching property. In this case, the hydrophobic polymer layer may be formed by coating thereon a solution of the hydrophobic polymer dissolved in an organic solvent or an aqueous latex of the polymer. The coating amount is preferably from 0.05 g/m² to about 1 g/m² as dry weight.

As the hydrophobic polymer being used for forming the foregoing hydrophobic polymer layer, there are cellulose esters (e.g., nitrocellulose and cellulose triacetate); vinylic polymers containing vinyl chloride, vinylidene chloride or vinyl acrylate; organic solvent-soluble polyamide; and polyesters.

The hydrophobic polymer layer may contain a lubricant such as the organic carboxylic acid amide as described in JP-A-55-79435 for imparting thereto a sliding property, or may contain a matting agent.

In the case of forming a subbing layer on the temporary support, vinylidene chloride series copolymers as described in JP-A-51-135526 (corresponding to U.S. Pat. No. 4,087,574), U.S. Pat. Nos. 3,143,421, 3,586,508, 2,698,235, and 3,567,452; diolefin series copolymers such as butadiene as descried in JP-A-51-114120 (corresponding to U.S. Pat. No. 4,429,039) and U.S. Pat. No. 3,615,556; glycidyl acrylate- or glycidyl methacrylate-containing copolymers as descried in JP-A-51-58469; polyamide-epichlorohydrin resins as described in JP-A-48-24923 (corresponding to U.S. Pat. No. 3,877,673); and maleic anhydride-containing copolymers as described in JP-A-50-39536 (corresponding to U.S. Pat. No. 4,124,395) can be used.

In this invention, the electrically conductive layers described in JP-A-56-82504, JP-A-56-143443 (corresponding to U.S. Pat. No. 4,416,963), JP-A-57-104931 (corresponding to U.S. Pat. No. 4,418,141), JP-A-57-118242 (corresponding to U.S. Pat. No. 4,394,441), JP-A-58-62647, and JP-A-60-258541 can also be suitably used.

When the electrically conductive fine particles are compounded with a plastic raw material same as or different from that used in the temporary support film and coextruded while extruding the temporary support film, an electrically conductive layer excellent in adhesion and scratching resistance can be easily obtained. Hence, in this case, it is unnecessary to form the foregoing hydrophobic polymer layer and subbing layer. Thus, the electrically conductive layer is a particularly preferred embodiment of this invention.

In addition, in the case of coating an electrically conductive layer, an ordinary coating method such as a roller coating method, an air knife coating method, a gravure coating method, a bar coating method, or a curtain coating method can be employed.

For preventing the occurrence of electrostatic shock caused by electrostatic charging by use of the photosensitive transfer material of this invention, it is necessary that the surface electric resistance of the temporary support having an electrically conductive layer or imparted with an electric conductivity is reduced below $10^{13}$ $\Omega$, and preferably below $10^{12}$ $\Omega$.

Also, for improving the sliding property of the photosensitive transfer material of this invention and for preventing the undesirable occurrence of adhesion of the photosensitive resin layer to the back surface of the temporary support, it is useful to coat the back surface of the temporary support with a sliding composition containing known fine particles or a releasing agent composition containing silicone compound.

When the electrically conductive layer is formed on the back side of the temporary support, the adhesion of the thermoplastic resin layer and the temporary support may be improved by a surface treatment such as a glow discharging treatment, a corona discharging treatment, and an ultraviolet radiation treatment can be applied to the surface of the temporary support; a phenolic material such as a cresol novolak resin, or resorcinol can be added into the thermoplastic resin layer; a subbing treatment of a polyvinylidene chloride resin, styrene butadiene rubber, or gelatin can be applied to the temporary support; or a combination of these treatments can be employed.

When the thermoplastic resin is alkali soluble, a polyethylene terephthalate film under-coated with gelatin after being subjected to a corona discharging treatment, is preferred as a temporary support since the film shows a particularly excellent adhesion. In this case, the thickness of the gelatin layer is preferably from 0.01 $\mu$m to 2 $\mu$m.

The image-forming process using the photosensitive transfer material of this invention is explained below.

First, the covering sheet of the photosensitive transfer material is removed. Next, the photosensitive resin layer of the photosensitive transfer material is adhered to a permanent support while pressing and heating. For the purpose, a conventional laminator or a vacuum laminator can be used. Also, for increasing the producibility, an auto cut laminator can be used. After peeling off the temporary support and the thermoplastic resin layer, the photosensitive resin layer on the substrate is pattern-exposed through the separating layer, and then developed, thereby forming images on the permanent support.

The development is carried out in an ordinary manner, for example, by immersing the photosensitive resin layer in a solvent or an aqueous developer, in particular, an aqueous alkali solution; or by spraying a developer onto the photosensitive resin layer; or by rubbing the surface with a brush; or by applying thereto ultrasonic waves in the developer.

By using multiple photosensitive transfer materials, each having a photosensitive resin layer of a different color, and repeating the foregoing steps multiple times, multicolor images or multicolor patterns can be formed.

The main use of the photosensitive transfer material of this invention is not only the preparation of printed circuit boards but also the preparation of multicolor images or multicolor patterns. The present invention is also suitably used for making color filters or as a protective layer for color filters.

For making a printed circuit board, a known copper-plated or copper-attached laminate plate is used as the substrate. Also, for making a color filter, a known glass plate or a sodium glass plate having formed on the surface thereof a silicon oxide coating, is used as the substrate.

The invention is explained in detail by referring to the following examples, but the invention is not limited to these examples.

EXAMPLE 1

Formation of Thermoplastic Resin Layer

A temporary support composed of a polyethylene terephthalate film having a thickness of 100 $\mu$m was coated with a coating liquid having the following composition H1, and dried to form a thermoplastic resin layer having a dry thickness of 20 $\mu$m.

| Thermoplastic Resin Layer Composition H1: | |
|---|---|
| Vinyl Chloride/Vinyl Acetate Copolymer (75/25 by weight ratio, polymerization degree: about 400, MPR-TSL, trade name, made by Nisshin Kagaku K.K.) | 290.0 g |
| Vinyl Chloride/Vinyl Acetate/Maleic Acid Copolymer (86/13/1 by weight ratio, polymerization degree: about 400, MPR-TM, trade name, made by Nisshin Kagaku K.K.) | 76.0 g |
| Dibutyl Phthalate | 88.5 g |
| Fluorine Series Surface Active Agent (F-177P, trade name, made by Dainippon Ink and Chemicals, Inc.) | 5.4 g |
| Methyl Ethyl Ketone (MEK) | 975.0 g |

Formation of Separating Layer

Next, the foregoing thermoplastic resin layer was coated with a coating liquid having following composition B1, and dried to form a separating layer having a dry thickness of 1.6 $\mu$m.

| Separating Layer Composition B1: | |
|---|---|
| Polyvinyl Alcohol (PVA 205, saponification ratio = 80%, made by Kuraray Co., Ltd.) | 173.2 g |
| Fluorine Series Surface Active Agent | 8 g |
| Distilled Water | 2800 g |

Formation of Photosensitive Resin Layer

Each of 4 temporary supports, each having the foregoing thermoplastic resin layer and separating layer was coated with the 4 kinds of photosensitive coating liquids shown in Table 1 below each colored in different color, each of the 4 kinds of coating liquids used with one of each of the 4 kinds of photosensitive layers, e.g., black (for B1 layer), red (for red layer), green (for G layer) or blue (for B layer), followed by drying to form each colored photosensitive resin layer having a dry thickness of 2 $\mu$m on each separating layer.

TABLE 1

| Compositions of Coating Liquids for Colored Photosensitive Layers | | | | |
|---|---|---|---|---|
| | R (g) | B (g) | G (g) | B1 (g) |
| Benzyl Methacrylate/Methacrylic Acid Copolymer (70/30 by mol ratio, viscosity = 0.12) | 60 | 60 | 60 | 60 |
| Pentaerythritol Tetraacrylate | 43.2 | 43.2 | 43.2 | 43.2 |
| Michler's Ketone | 2.4 | 2.4 | 2.4 | 2.4 |
| 2-(o-Chlorophenyl)-4,5-diphenyl Imidazole Dimer | 2.5 | 2.5 | 2.5 | 2.5 |
| Irgazin Red BPT (red) | 5.4 | | | |
| Sudan Blue (blue) | | 5.2 | | |
| Copper Phthalocyanine (green) | | | 5.6 | |
| Carbon Black (black) | | | | 5.6 |
| Methylcellosolve Acetate | 560 | 560 | 560 | 560 |
| Methyl Ethyl Ketone | 280 | 280 | 280 | 280 |

Lamination of Covering Sheet

Furthermore, a covering sheet of polypropylene having a thickness of 12 $\mu$m was laminated under pressure on each of the foregoing photosensitive resin layers to provide 4 kinds of red, blue, green, and black photosensitive transfer materials.

Preparation of Color Filter

Using the photosensitive transfer materials, a color filter was prepared by the following method.

The covering sheet of the red photosensitive transfer material was peeled off, the surface of the photosensitive resin layer was adhered to a transparent glass substrate of 1.1 mm in thickness using a laminator (VP-11, trade name, made by Taisei Laminator K.K.) while pressing (0.8 kg/m$^2$) and heating (130° C). Next, the temporary support and the thermoplastic resin layer were simultaneously removed at the interface between the separating layer and the thermoplastic resin layer.

Next, the photosensitive resin layer was pattern-exposed through a definite photomask, and then developed to remove unnecessary portions, thereby forming a red pixel pattern on the glass substrate.

Next, the green photosensitive transfer material was adhered to the glass substrate having formed thereon the red pixel pattern by the same manner as described above. The temporary support and the thermoplastic resin layer were peeled off, and exposure and development were carried out as explained above to form a green pixel pattern.

The same steps were also repeated using the blue photosensitive transfer material and then the black photosensitive transfer material to form the desired color filter on the transparent glass substrate.

The color filter formed had no lack of pixels and the adhesion thereof with the substrate was good.

COMPARISON EXAMPLE 1

By following the same procedure as set out in Example 1 without using the thermoplastic resin layer in each case, each of the red, green, blue and black photosensitive transfer materials, each having in sequence a separating layer of polyvinyl alcohol and the photosensitive resin layer on a polyethylene terephthalate film having a thickness of 100 μm, was prepared.

Next, by adhering each color photographic transfer material to a transparent glass substrate as in Example 1, followed by exposure and development, a color filter on the transparent glass substrate was formed.

In the cases where the second, third and fourth color photosensitive transfer materials were adhered to the glass substrate without the use of the thermoplastic resin layer, bubbles remained, the lack of pixels was observed, and also the adhesion of the color filter with the substrate was poor since bubbles remained in the pixels.

EXAMPLE 2

A polyethylene terephthalate film having a thickness of 20 μm was coated on the thermoplastic resin layer having the same composition as in Example 1, and having a dry thickness of 10 μm. Then, the separating layer having the same composition as in Example 1, and having a thickness of 1.5 μm was formed on the thermoplastic resin layer.

On the separating layer was coated a coating liquid for a photosensitive resin layer having the composition shown below, and dried to form a photoresist layer having a dry thickness of 20 μm.

| Coating liquid Composition for Photosensitive Resin Layer: | |
|---|---|
| | (weight part) |
| Methyl Methacrylate/2-Ethylhexyl Acrylate/Benzyl Methacrylate/Methacrylic Acid Copolymer (55/28.8/11.7/4.5 by mol ratio, weight mean molecular weight = 90,000) | 15 |
| Polypropylene Glycol Diacrylate (mean molecular weight = 822) | 6.5 |
| Tetraethylene Glycol Dimethacrylate | 1.5 |
| p-Toluenesulfonamide | 0.5 |
| 1,4-Bis(N,N-diethylamino)benzophenone | 0.04 |
| Benzophenone | 1.0 |
| Malachite Green Oxalate | 0.02 |
| 3-Morpholinomethyl-1-phenyltriazol-2-thione | 0.01 |
| Leico Crystal Violet | 0.2 |
| Tribromomethylphenylsulfone | 0.1 |
| Methyl Ethyl Ketone | 30 |

Finally, a polyethylene film having a thickness of 20 μm was laminated on the photoresist layer to provide a dry film photoresist.

After peeling off the polyethylene film, the dry film photoresist material was laminated on a copper-laminated plate having a cleaned copper surface such that the photoresist layer was closely attached to the copper surface without forming bubbles between them by means of a heat roll laminator.

After peeling off the polyethylene terephthalate film and the thermoplastic resin layer from the laminate, the photoresist layer was exposed to ultraviolet rays through a photomask having a desired circuit pattern for a printed circuit board and the separating layer using a printer manufactured by Oak Co., and then developed by spraying thereon an aqueous 1% sodium carbonate solution to form an etching resist having a circuit pattern on the copper-laminated plate. Thus, a resist image of a circuit pattern having a high resolving power and no undesirable defects such as peeling off was formed.

Next, a cupric chloride etchant was sprayed onto the etching resist. The copper portions which were uncovered by the etching resist were dissolved off. Then, the remaining etching resist only was removed by spraying thereon an aqueous 2% sodium hydroxide solution.

Thus, a printed circuit of copper having high resolving power and high precision was formed on a glass epoxy resin plate.

COMPARISON EXAMPLE 2

By following the same procedure as set out in Example 2 without using the thermoplastic resin layer, a photosensitive transfer material was prepared. Using the photosensitive transfer material, a resist pattern was formed on a copper-laminated plate having the cleaned copper surface by the same manner as in Example 2. A pattern image was obtained, but the adhesion of the pattern image to the substrate was too poor for practical use.

EXAMPLE 3

By following the same procedure as provided in Example 1 except that the thermoplastic resin layer having a thickness of 15 μm and composed of composition H1, multicolor images were formed. In this case, no residual bubbles were observed at the transfer of each color and multilayer images and no defect in image form was observed. Further, no pin holes were obtained on the glass plate.

EXAMPLE 4

By following the same procedure as provided in Example 1 except that the following composition H2 for the thermoplastic resin layer was used in place of the composition H1, 4 kinds of photosensitive transfer materials were prepared.

| Composition H2 for Thermoplastic Resin Layer: | |
|---|---|
| | (weight part) |
| Dianal BR 85 (acryl resin, weight mean molecular weight = 250,000, trade name made by Mitsubishi Rayon Co., Ltd.) | 1.8 |
| Dianal BR 77 (acryl resin, weight mean molecular weight = 80,000, trade name, made by Mitsubishi Rayon Co., Ltd.) | 1.2 |
| Trimethylolpropane Triacrylate | 1.22 |
| Tetraethylene Glycol Diacrylate | 0.5 |
| p-Toluenesulfonamide | 0.32 |
| Benzophenone | 0.008 |
| Methyl Ethyl Ketone | 12.6 |

When using the photosensitive transfer materials, multicolor images were formed by the same manner as in Example 1, no residual bubbles were observed at the transfer of each color and multicolor images and no defect in image form was observed. Further, no pin holes were formed on the glass plate.

EXAMPLE 5

By following the sample procedure as provided in Example 1 except that the following composition H3 for the thermoplastic resin layer was used in the place of composition H1, 4 kinds of photosensitive transfer materials were prepared.

| Composition H3 for Thermoplastic Resin Layer: | |
| --- | --- |
| | (weight part) |
| Methyl Methacrylate/2-Ethylhexyl Acrylate/Benzyl Methacrylate/Methacrylic Acid Copolymer (55/28.8/11.7/4.6, weight mean molecular weight = 90,000) | 15 |
| Polypropylene Glycol Diacrylate (mean molecular weight = 822) | 6.5 |
| Tetraethylene Glycol Dimethacrylate | 1.5 |
| p-Toluenesulfonamide | 0.5 |
| Benzophenone | 1.0 |
| Methyl Ethyl Ketone | 30 |

When using the photosensitive transfer materials, multicolor images were formed by the same manner as in Example 1. No residual bubbles were observed at the transfer of each color and multicolor images and no defect in image form was observed. Further, no pin holes were formed on the glass plate.

EXAMPLE 6

A polyethylene terephthalate film having a thickness of 50 μm was laminated with a polypropylene film having a thickness of 2 μm through an adhesive layer. The coating liquid having the composition B1 shown in Example 1 was coated on the surface of the polypropylene film. Drying followed, forming a separating layer having a dry thickness of 1.6 μm. Next, a covering sheet having a thickness of 12 μm each was adhered under pressure to each of the sheets having the B1 layer, R layer, G layer, and B layer, respectively, formed as in Example 1.

Using these films, a color filter having the pixels of R, G, and B and a light-shielding pattern of B1 was formed on a glass plate. In these steps, no residual bubbles were observed at the transfer of each color, and neither defect nor lifting was observed on the pixel pattern.

EXAMPLE 7

Formation of Thermoplastic Resin Layer

A polyethylene terephthalate film of 100 μm in thickness having a gelatin subbing layer of 0.08 μm in thickness on one surface was used as a temporary support. A coating liquid having the following composition was coated on the gelatin layer and dried to form a thermoplastic resin layer having a dry thickness of 15 μm.

| Composition H4 for Thermoplastic Resin Layer: | |
| --- | --- |
| | (weight part) |
| Methyl Methacrylate/2-Ethylhexyl Acrylate/Benzyl Methacrylate/Methacrylic Acid Copolymer (55/28.8/11.7/4.5, weight mean molecular weight = 90,000) | 150 |
| Propylene Glycol (mean molecular weight = 700) | 60 |
| Arron GF-150 (fluorine series graft polymer, trade name, made by Toagosei Chemical Industry Co., Ltd.) | 1.08 |
| Methyl Ethyl Ketone | 90 |
| Methoxy Propanol | 180 |

Formation of Separating Layer

Next, A coating liquid having the following composition B2 for a separating layer was coated on the foregoing thermoplastic resin layer, and dried to form a separating layer having a thickness of 1.8 μm.

| Composition B2 for Separating Layer: | |
| --- | --- |
| | (weight part) |
| Polyvinyl Alcohol (PVA205, saponification ratio = 80%, trade name, made by Kuraray Co., Ltd.) | 130 |
| Polyvinyl Pyrrolidone (PVP K-90, trade name, made by GAF corporation) | 60 |
| Serfron S-131 (fluorine series surface active agent, trade name, made by Asahi Glass Co., Ltd.) | 10 |
| Methanol | 1675 |
| Distilled Water | 1675 |

Formation of Photosensitive Resin Layer

The photosensitive coating liquids for 4 kinds of colored photosensitive resin layer, e.g., red (for R layer), green (for G layer), blue (for B layer), and black (for light-shielding layer, K layer) were prepared as shown in Table 2 below.

TABLE 2

| Compositions of Coating Liquids for Colored Photosensitive Layers | | | | |
| --- | --- | --- | --- | --- |
| | R (g) | B (g) | G (g) | K (g) |
| Benzyl Methacrylate/Methacrylic Acid Copolymer (73/27 by mol ratio, viscosity = 0.12) | 60 | 60 | 60 | 60 |
| Pentaerythritol Tetraacrylate | 43.2 | 43.2 | 43.2 | 43.2 |
| Michler's Ketone | 2.4 | 2.4 | 2.4 | 2.4 |
| 2-(o-Chlorophenyl)-4,5-diphenyl Imidazole Dimer | 2.5 | 2.5 | 2.5 | 2.5 |
| Irgazin Red BPT (red) | 5.4 | — | — | — |
| Sudan Blue (blue) | — | 5.2 | — | — |
| Copper Phthalocyanine (green) | — | — | 5.6 | — |
| Carbon Black (black) | — | — | — | 5.6 |
| Methylcellosolve Acetate | 560 | 560 | 560 | 560 |
| Methyl Ethyl Ketone | 280 | 280 | 280 | 280 |

Each of the coating liquids for the R, B, G and K layers was coated or each separating layer formed above and dried to form each of 4 colored photosensitive resin layers, each having a dry thickness of 2 μm.

Lamination of Covering Sheet

Furthermore, a covering sheet of polypropylene having a thickness of 12 μm was laminated under pressure on each of the foregoing colored photosensitive resin layers to provide 4 kinds of red, blue, green and black photosensitive transfer materials.

Preparation of Color Filter

Using the photosensitive transfer materials prepared as described above, a color filter was prepared as follows.

The covering sheet of the red photosensitive transfer material was peeled off, the photosensitive resin layer of the photosensitive transfer material was adhered to a transparent glass substrate (thickness of 1.1 mm) having a silicon oxide layer of 300 Å in thickness on the surface thereof, using a laminator (VP-11, trade name, made by Taisei Lamonator K.K.) under pressing (0.8 kg/cm$^2$) and heating (130° C.). The temporary support and the thermoplastic resin layer were simultaneously peeled off at the interface between the separating layer and the thermoplastic resin layer. In this case, since both the adhesion of the temporary support and the thermoplastic resin layer, and also the adhesion between the separating layer and the photosensitive resin layer were sufficient, the photosensitive resin layer and the separating layer completely remained on the substrate.

Next, the photosensitive resin layer was exposed through a definite photomask and the separating layer and developed to remove unnecessary portions. A red pixel pattern was thereby formed on the glass substrate.

After removing the covering sheet, the green photosensitive transfer material was adhered to the glass substrate having the red pixel pattern as described above, the temporary support and the thermoplastic resin layer were peeled off, and the photosensitive resin layer was exposed and developed to form a green pixel pattern. When the green photosensitive resin layer was laminated on the red pixel pattern, bubbles were not formed between them in spite of the existence of the unevenness of the red pixel pattern. Thus, neither defect nor lifting was observed on the green pixel pattern obtained after development.

By repeating the same step using the blue photosensitive transfer material and the black photosensitive transfer material, a color filter was formed on the transparent glass substrate.

The color filter obtained had no lack of each pixel and showed good adhesion with the substrate. Furhter, stains based on oozing of the thermoplastic resin to the periphery of the substrate were not observed.

EXAMPLE 8

Coating composition H4 was coated on the polyethylene terephthalate film of 20 μm in thickness having a gelatin subbing layer of 0.08 μm in thickness, forming a thermoplastic resin layer as shown in Example 7 with a dry thickness of 10 μm. On the thermoplastic layer was coated composition B2 for a separating layer shown in Example 7 to form a separating layer having a thickness of 1.5 μm. Further, a coating liquid for a photosensitive resin layer shown in Example 2 was coated on the separating layer, followed by drying to form a photoresist layer having a thickness of 10 μm.

Finally, a polyethylene film having a thickness of 20 μm was laminated on the photoresist layer to provide a photosensitive transfer material (dry film photoresist).

After peeling off the polyethylene film of the dry film photoresist, the photoresist was laminated in a copper-laminated plate having the cleaned copper surface such that the photoresist layer was closely brought into contact with the copper surface using a heat roll laminator.

Next, after peeling off both the polyethylene terephthalate film and the thermoplastic resin layer, the photoresist layer was exposed to ultraviolet rays through a photomask having a desired circuit pattern of a printed circuit board using a 5 kW super high-pressure mercury lamp printer manufactured by Oak Co. The photoresist layer was then developed by spraying an aqueous 1% sodium carbonate solution to form an etching resist having the circuit pattern on the copper-laminated plate. In this case, the residue of oozed thermoplastic resin layer was not observed at the periphery of the substrate. Also, a resist image of the circuit pattern having a very high resolving power and no undesirable defect such as peeling was obtained.

Next, a cupric chloride etchant was sprayed onto the etching resist. The copper portions uncovered by the resist were dissolved off. The remaining etching resist was removed by spraying thereon an aqueous 2% sodium hydroxide solution. Thus, a printed circuit of copper having high resolving power and high precision was formed on a glass epoxy resin plate.

EXAMPLE 9

By following the same procedure as provided in Example 7 except that a thermoplastic resin layer of 20 μm in thickness composed of composition H4 was used, multicolor images were formed. In this case, since the adhesion of each layer was good and no residual bubbles were observed at the transfer of each color, multicolor images having no defect in each color image were formed. No pin holes were obtained on the glass plate. Also, the residue of the thermoplastic resin caused by oozing the resin to the periphery of the images was not observed.

EXAMPLE 10

Formation of Thermoplastic Resin Layer

A coating liquid having the following composition H5 was coated on an untreated polyethylene terephthalate film having a thickness of 100 μm as a temporary support. The film was dried to form a thermoplastic resin layer having a dry thickness of 15 μm.

|  | (weight part) |
|---|---|
| Methyl Methacrylate/2-Ethylhexyl Acrylate/Benzyl Methacrylate/Methacrylic Acid Copolymer (55/28.8/11.7/4.5 by mol ratio, weight mean molecular weight = 90,000) | 150 |
| Polypropylene Glycol (mean molecular weight = 700) | 60 |
| Arron GF-150 (fluorine series graft polymer, trade name, made by Toagosei Chemical Industry Co., Ltd.) | 1.08 |
| Cresol Novolak Resin | 20 |
| Methyl Ethyl Ketone | 90 |
| Methoxypropanol | 180 |

A separating layer of composition B2 described in Example 7 and each of R, G, B, and K photosensitive resin layers as in Example 7 were formed on the thermoplastic resin layer to provide 4 kinds of photosensitive transfer materials.

By the same manner as in Example 7 using these photosensitive transfer materials, a color filter was prepared. In the step of laminating the red photosensitive resin layer onto the glass substrate, both the adhesion between the temporary support and the thermoplastic resin layer and also the adhesion between the separating layer and the photosensitive resin layer were sufficient. The photosensitive resin layer and the separating layer completely remained on the substrate. Also, in the subsequent steps of exposure and development, the adhesion of both the foregoing layers was good. Also, in the steps of laminating the second green photosensitive resin layer, the blue photosensitive resin layer, and the black (K) photosensitive resin layer, the adhesion thereof was good. Thus, green images, blue images and black images were formed. The color filter obtained did not lack each color pixel and showed good adhesion with the substrate. Also, strains caused by oozing of the thermoplastic resin to the periphery of the substrate were not observed.

EXAMPLE 11

Formation of Electrically Conductive Temporary Support

Samples (a) to (e), each having formed on one surface of a polyethylene terephthalate film having a thickness of 100 μm, an electrically conductive layer having a different surface resistance, were prepared by the following method.

Preparation of Sample (a):

By dissolving 65 parts by weight of stannic chloride hydrate and 1.5 parts by weight of antimony trichloride in 1,000 parts by weight of ethanol, a homogeneous solution was obtained. To the solution was added dropwise an aqueous solution of 1N sodium hydroxide until the pH of the foregoing solution became 3, thereby forming colloidal co-precipitations of stannic oxide and antimony oxide. The co-precipitations were then allowed to stand for 24 hours at 50° C. to provide red-brown colloidal precipitates.

The precipitates were separated by centrifugal separation. For removing excessive ions therefrom, the precipitates were washed with water and then subjected again to centrifugal separation. By repeating this operation three times, excessive ions were removed.

After mixing 100 parts by weight of the precipitates with 1,000 parts by weight of water, the mixture was sprayed into a burning furnace heated to 650° C. to provide bluish electrically conductive fine particles having a mean particle size of 0.15 μm.

The above-described electrically conductive fine particles were dispersed in the following composition for 5 hours using a paint shaker (manufactured by Toyo Seizai Seisakusho K.K.).

|  | (weight part) |
| --- | --- |
| Electrically Conductive Fine Particles | 200 |
| Salan F-310 (vinylidene chloride series copolymer, trade name, made by Asahi Dow Co.) | 10 |
| Methyl Ethyl Ketone | 150 |

A coating liquid having the following composition was prepared using the foregoing dispersion.

|  | (weight part) |
| --- | --- |
| Foregoing Dispersion | 15 |
| Saran F-310 | 3 |
| Methyl Ethyl Ketone | 100 |
| Cyclohexanone | 20 |
| m-Cresol | 5 |

The coating liquid was coated in a polyethylene terephthalate film having a thickness of 100 μm at a dry coated amount of 1.3 g/m$^2$, and subsequently dried for 2 minutes at 130° C.

Furthermore, a coating liquid having the following composition was coated on the layer at a dry coated amount of 0.2 g/m$^2$, and subsequently dried for one minute at 130° C.

|  | (weight part) |
| --- | --- |
| Cellulose Triacetate | 1 |
| Methylene Dichloride | 60 |
| Ethylene Dichloride | 40 |

| -continued | |
| --- | --- |
|  | (weight part) |
| Erucic Acid Amide | 0.01 |

Thus, sample (a) was obtained. The surface electric resistance of sample (a) measured by an insulation resistance measurement device (Type VE-30, trade name, made by Kawaguchi Denkyoku K.K.) was $7 \times 10^8$ Ω at 25° C., 25% RH.

Preparation of Samples (b) to (e):

By following the same procedure as above except for changing the addition amount of the foregoing electrically conductive fine particles, samples (b) to (e) were prepared. The electric resistance value of each sample was as follows.

| Sample (b) | $10^{10}$ |
| --- | --- |
| Sample (c) | $10^{11}$ |
| Sample (d) | $10^{12}$ |
| Sample (e) | $10^{13}$ |

Using each of foregoing samples (a) to (e) as a temporary support, a gelatin layer having a thickness of 0.08 μm was formed on each sample on the opposite surface to the surface having the conductive layer. Then, a coating liquid having composition H4 for a thermoplastic resin layer shown in Example 7 was coated on the gelatin layer, and dried. Next, a coating liquid having composition B2 for a separation layer shown in Example 7 was coated, and thereafter, each of the blue, green, red and black photosensitive resin layers as in Example 7 was formed to provide 4 photosensitive transfer materials. By using the thus obtained photosensitive transfer materials, a color filter was formed on a glass substrate. During these steps, no electric shock occurred to an operator when peeling off the temporary support from the thermoplastic resin layer. Further, the undesirable defects of dust accumulation was reduced.

REFERENCE EXAMPLE 1

In place of a coating liquid of the composition shown in Example 7, a thermoplastic resin layer composition insoluble in an aqueous alkali solution having the composition shown below was coated on one surface of a polyethylene terephthalate film of 100 μm in thickness having a gelatin subbing layer of 0.08 μm in thickness.

| Composition H6 of Coating Liquid for Thermoplastic Resin Layer: | |
| --- | --- |
|  | (weight part) |
| Dianal BR 85 (acryl resin, weight mean molecular weight = 250,000, trade name made by Mitsubishi Rayon Co., Ltd.) | 1.8 |
| Dianal BR 77 (acryl resin, weight mean molecular weight = 80,000, trade name, made by Mitsubishi Rayon Co., Ltd.) | 1.2 |
| Trimethylolpropane Triacrylate | 1.22 |
| Tetraethylene Glycol Diacrylate | 0.5 |
| p-Toluenesulfonamide | 0.32 |
| Benzophenone | 0.008 |
| Methyl Ethyl Ketone | 12.6 |

Then, by following the same procedure as provided in Example 7, multicolor images were formed. In this case, no residual bubbles were observed at the transfer of each color. Further, multicolor images having no defect in each image form and no pin holes were formed on the glass substrate.

However, in this case, a residue of the thermoplastic resin layer caused by oozing of the resin layer was observed at the periphery of the imaged portions.

REFERENCE EXAMPLE 2

In place of using the composition for the thermoplastic resin layer in Example 7, a coating liquid having composition H1 for a thermoplastic resin layer was used.

Then, multicolor images were formed by the same manner as in Example 7. In this case, no residual bubbles were observed at the transfer of each color. Further, multicolor images having no defect in each image form and no pin holes were formed on a glass substrate. However, in this case, the residue of the thermoplastic resin layer caused by oozing the resin layer was observed at the periphery of the imaged portions.

REFERENCE EXAMPLE 3

Without forming the thermoplastic resin layer shown in Example 7 on a polyethylene terephthalate film of 100 μm in thickness having a gelatin subbing layer of 0.08 μm in thickness, each of red, green, blue and black photosensitive transfer materials was prepared by forming in sequence on the polyethylene terephthalate film a separation layer having composition B2 and each photosensitive resin layer, as in Example 7.

By laminating each color photosensitive transfer material onto a transparent glass substrate followed by exposure and development and repeating the steps as in Example 7, a color filter was formed on the transparent glass substrate. In this case, during the lamination after the 2nd color, bubbles remained and lack of pixels was observed. Also, it was confirmed that since bubbles remained in the pixels, the adhesion of the color filter to the substrate was inferior.

REFERENCE EXAMPLE 4

By following the same procedure as in Example 8 except that composition H6 for a thermoplastic resin layer insoluble in an aqueous alkali solution shown in Reference Example 1 was used, the thermoplastic resin layer was formed on a polyethylene terephthalate film of 20 μm in thickness having a gelatin subbing layer. Then, a separation layer having composition B2 and photoresist layer as in Example 8 were formed on the thermoplastic resin layer to provide a photosensitive transfer material (dry film resist).

When a resist pattern was formed on a copper-laminated plate having the cleaned copper surface as in Example 8 using the photosensitive transfer material, fine images were obtained. However, residues were caused by oozing of the thermoplastic resin layer at the periphery of the imaged portion. When etching was applied thereto, the copper portions under the residues remained without being etched.

REFERENCE EXAMPLE 5

By following the same procedure as Example 7 except that the following composition H7 containing no Arron GF 150 for the thermoplastic resin layer was used in place of the composition for the thermoplastic resin layer in Example 7, red, blue, green, and black photosensitive elements (photosensitive transfer materials) were prepared.

| Composition H7 for Thermoplastic Resin Layer: | |
| --- | --- |
| | (weight part) |
| Methyl Methacrylate/2-Ethylhexyl Acrylate/Benzyl Methacrylate/Methacrylic Acid Copolymer (55/28.8/11.7/4.5 by mol ratio, mean molecular weight = 90,000) | 150 |
| Polypropylene Glycol (mean molecular weight = 700) | 60 |
| Methyl Ethyl Ketone | 90 |
| Methoxypropanol | 180 |

After peeling off the covering sheet of the red photosensitive element, the surface of the photosensitive resin layer was attached to a transparent glass substrate having a thickness of 1.1 mm using a laminator (VP-11, trade name, made by Taisei Laminator K.K.) while pressing (0.8 kg/cm$^2$) and heating (130° C.). Next, the temporary support and the thermoplastic resin layer could not be simultaneously peeled off at the interface between the separating layer and the thermoplastic resin layer. A part of them was peeled off between the red photosensitive resin layer and the separating layer.

The lacked portions of the separating layer on the red photosensitive resin layer formed on the transparent glass substrate were influenced by oxygen to greatly reduce their sensitivity. In the laminations of the photosensitive resin layers after the transfer of the 2nd color, the residue of bubbles was not observed. However, the peeling off property between the separating layer and the thermoplastic resin layer was inferior.

REFERENCE EXAMPLE 6

By following the same procedure as provided in Example 7 except that the following composition B3 for a separating layer containing no polypyrrolidone was used in place of the composition for the separating layer in Example 7. In this manner, red, blue, green and black photosensitive transfer materials were prepared.

| Coating Composition B3 for Separating Layer: | |
| --- | --- |
| | (weight part) |
| Polyvinyl Alcohol (PVA 205, saponification ratio = 80%, made by Kuraray Co., Ltd.) | 190 |
| Sarfron S-131 (fluorine series surface active agent, trade name, made by Asahi Glass Co., Ltd.) | 10 |
| Distilled Water | 3350 |

After peeling off the covering sheet of the red photosensitive transfer material, the surface of the photosensitive resin layer thereof was attached to a transparent glass substrate having a thickness of 1.1 mm using a laminator (VP-11, trade name, made by Taisei Laminator K.K.) while pressing (0.8 kg/cm$^2$) and heating (130° C.). Next, the temporary support and the thermoplastic resin layer could not be simultaneously peeled off at the interface between the separating layer and the thermoplastic resin layer. A part of them was peeled off between the red photosensitive resin layer and the separating layer.

At the lacked portion of the separating layer, the red photosensitive resin layer on the transparent glass substrate was influenced by oxygen to greatly reduce the sensitivity. In the laminations of the colored photosensitive resin layers after the 2nd color, residual bubbles and stains of the substrate visible after development were not observed.

REFERENCE EXAMPLE 7

By following the same procedure as provided in Example 7 except that a polyethylene terephthalate film of 100 μm in thickness having no gelatin subbing layer was used in place of the temporary support in Example 7, red, blue, green, and black photosensitive transfer materials were prepared.

After peeling off the covering sheet of the red photosensitive transfer material, the surface of the photosensitive resin layer was adhered to a transparent glass substrate having a thickness of 1.1 mm using a laminator (VP-11, made by Taisei Laminator K.K.) while pressing (0.8 kg/cm$^2$) and heating (130° C.). Next, the temporary support and the thermoplastic resin layer could not be peeled off at the interface between the separating layer and the thermoplastic resin layer. A part of them was peeled off between the thermoplastic resin layer and the temporary support, thereby a part of the thermoplastic resin layer remained on the separating layer.

In the portion of the separating layer on the red photosensitive resin layer on which a part of the thermoplastic resin layer attached, the development was delayed after exposure of the red photosensitive resin layer. Also, the resolving power of the red image was reduced.

The evaluation results of the above examples and the reference examples are shown in Table 3 below.

TABLE 3

Construction of Photosensitive Transfer Materials and Evaluation Results (1)

|  | Example 7 | Example 8 | Example 9 | Example 10 | Example 11 |
|---|---|---|---|---|---|
| Gelatin Subbing Layer | formed | formed | formed | not formed | formed |
| Thermoplastic Resn Layer[1] | H4 | H4 | H4 | H5 | H4 |
|  | 15 μm | 10 μm | 20 μm | 15 μm | 15 μm |
| Separation Layer PVP | formed | formed | formed | formed | formed |
| Thickness of Photosensitive Layer | 2 μm | 10 μM | 2 μm | 2 μm | 2 μm |
| Electrically Conductive Treatment | none | none | none | none | present |

TABLE 3-continued

Construction of Photosensitive Transfer Materials and Evaluation Results (1)

|  | Example 7 | Example 8 | Example 9 | Example 10 | Example 11 |
|---|---|---|---|---|---|
| Bubbles | ◯ | ◯ | ◯ | ◯ | ◯ |
| Stains | ◯ | ◯ | ◯ | ◯ | ◯ |
| Releasing Property | ◯ | ◯ | ◯ | ◯ | ◯ |
| Adhesion | ◯ | ◯ | ◯ | ◯ | ◯ |
| Electric Shock | Δ | Δ | Δ | Δ | ◯ |

◯: Good
Δ: Usable
Note:
[1]means characteristics of the thermoplastic resin layer.
H4: alkali-soluble, no cresol resin, releasing agent contained
H5: alkali-soluble, cresol resin contained, releasing agent contained

TABLE 4

Construction of Photosensitive Transfer Materials and Evaluation Results (2)

|  | Reference Example 1 | Reference Example 2 | Reference Example 3 | Reference Example 4 | Reference Example 5 | Reference Example 6 | Reference Example 7 |
|---|---|---|---|---|---|---|---|
| Gelatin Subbing Layer | formed | formed | formed | formed | formed | formed | not formed |
| Thermoplastic Resn Layer[2] | H6 | H1 | none | H6 | H7 | H4 | H4 |
|  | 15 μm | 15 μm |  | 15 μm | 15 μm | 15 μm | 15 μm |
| Separation Layer PVP | formed | formed | formed | formed | formed | not formed | formed |
| Thickness of Photosensitive Layer | 2 μm | 2 μm | 2 μm | 10 μm | 2 μm | 2 μm | 2 μm |
| Electrically Conductive Treatment | none | none | none | none | none | none | none |
| Bubbles | ◯ | ◯ | X | ◯ | ◯ | ◯◯ |  |
| Stains | X | X | — | X | ◯ | ◯ | ◯ |
| Releasing Property | ◯ | ◯ | — | ◯ | X | X | ◯ |
| Adhesion | ◯ | ◯ | ◯ | ◯ | ◯ | ◯ | X |
| Electric Shock | Δ | Δ | Δ | Δ | Δ | Δ | Δ |

◯: Good
Δ: Usable
X: Unusable
—: Not evaluated
Note:
[2]means characteristics of the thermoplastic resin layer.
H1: solvent-soluble
H4: alkali-soluble, no cresol resin, releasing agent contained
H6: solvent-soluble
H7: alkali-soluble, no cresol resin, no releasing agent According to this invention, an alkali-soluble thermoplastic resin layer is formed between the temporary support and the photosensitive resin layer and separating layer being transferred onto a substrate. These layers can be transferred onto a substrate having an uneven surface without forming residual bubbles. The occurrence of stains caused by oozing of the thermoplastic resin layer while laminating can be prevented. Further, a monochromatic and multicolor pattern having an excellent quality and multicolor images can be formed by a simple method.

While the invention has been described in detail and with reference to specific embodiments thereof, it will be apparent to one skilled in the art that various changes and modifications can be made therein without departing from the spirit and scope thereof.

What is claimed is:

1. A photosensitive transfer material comprising a temporary support having formed thereon in sequence a thermoplastic resin layer, a separating layer having only slight permeability to oxygen, and a photosensitive resin layer, wherein the adhesion between the thermoplastic resin layer and the separating layer is weakest.

2. A photosensitive transfer material as in claim 1, wherein the thermoplastic resin layer is soluble in an aqueous alkali solution and contains a releasing agent.

3. A photosensitive transfer material as in claim 2, wherein the temporary support is a plastic film having a gelatin subbing layer.

4. A photosensitive transfer material as in claim 3, wherein the gelatin subbing layer has a thickness of from 0.01 μm to 2 μm.

5. A photosensitive transfer material as in claim 2, wherein the surface electric resistance of the temporary support is $10^{13}$ Ω or less.

6. A photosensitive transfer material as in claim 2, wherein the alkali-soluble thermoplastic resin layer has a softening point of 100° C. or lower.

7. A photosensitive transfer material as in claim 1, wherein the separating layer is soluble or dispersible in at least water and an aqueous solution.

8. A photosensitive transfer material as in claim 7, wherein the separating layer contains polyvinyl pyrrolidone in an amount of from 1 to 75% by weight of the solid components of the separating layer.

9. A photosensitive transfer material as in claim 1, wherein the temporary support has a thickness of 5 to 300 μm.

10. A photosensitive transfer material as in claim 1, wherein the temporary support has a thickness of 20 to 150 μm.

11. A photosensitive transfer material as in claim 1, wherein the thermoplastic resin layer has a softening point of 80° C. or lower.

12. A photosensitive transfer material as in claim 1, wherein the thermoplastic resin layer has a softening point of 50° C. or lower.

13. A photosensitive transfer material as in claim 1, wherein the thermoplastic resin layer has a thickness of 6 μm or greater.

14. A photosensitive transfer material as in claim 1, wherein the separating layer contains polyvinyl alcohol with a saponification ratio of 80% of higher.

15. A photosensitive transfer material as in claim 1, wherein the separating layer has a thickness of 0.1 μm to 5 μm.

16. A photosensitive transfer material as in claim 1, wherein the separating layer has a thickness of 0.5 μm to 2 μm.

17. A photosensitive transfer material as in claim 1, wherein the photosensitive resin layer is composed of a photopolymerizable resin composition.

18. An image-forming process, which comprises the steps of
 (a) adhering a photosensitive transfer layer of a photosensitive transfer material comprising
  a temporary support having formed thereon in sequence a thermoplastic resin layer, a separating layer having only slight permeability to oxygen, and a photosensitive resin layer, wherein the adhesion between the thermoplastic resin layer and the separating layer is weakest,
 to a permanent support while heating,
 (b) peeling off the temporary support and the thermoplastic resin layer,
 (c) pattern-exposing the photosensitive resin layer through the separating layer, and
 (d) developing the photosensitive resin layer to form images on the permanent support.

19. An image-forming process which comprises repeating two or more times the steps of claim 18 using multiple photosensitive transfer materials as in claim 18, wherein each photosensitive resin layer is a different color, thereby forming multicolor images.

* * * * *